(12) United States Patent
Baran

(10) Patent No.: US 9,504,167 B2
(45) Date of Patent: Nov. 22, 2016

(54) METHOD OF PRODUCING A CABLE CONNECTOR DEVICE WITH BLADE

(71) Applicant: Jozsef Laszlo Baran, Budapest (HU)

(72) Inventor: Jozsef Laszlo Baran, Budapest (HU)

(73) Assignee: Jozsef Laszlo Baran, Budapest (HU)

( * ) Notice: Subject to any disclaimer, the term of this patent is extended or adjusted under 35 U.S.C. 154(b) by 70 days.

(21) Appl. No.: 14/452,506

(22) Filed: Aug. 5, 2014

(65) Prior Publication Data

US 2015/0313023 A1 Oct. 29, 2015

(30) Foreign Application Priority Data

Apr. 24, 2014 (HU) ..................................... 1400211

(51) Int. Cl.
| | |
|---|---|
| *H05K 3/34* | (2006.01) |
| *H01B 7/00* | (2006.01) |
| *H05K 1/18* | (2006.01) |
| *H01R 4/24* | (2006.01) |
| *H01R 12/51* | (2011.01) |
| *H01R 43/01* | (2006.01) |
| *H01R 43/02* | (2006.01) |
| *H01R 12/58* | (2011.01) |
| *H01R 13/405* | (2006.01) |
| *H01R 13/52* | (2006.01) |
| *H01R 43/00* | (2006.01) |

(52) U.S. Cl.
CPC .......... *H05K 3/3405* (2013.01); *H01B 7/0009* (2013.01); *H01R 4/242* (2013.01); *H01R 12/515* (2013.01); *H01R 43/01* (2013.01); *H01R 43/0256* (2013.01); *H05K 1/18* (2013.01); *H01R 12/58* (2013.01); *H01R 13/405* (2013.01); *H01R 13/5213* (2013.01); *H01R 43/005* (2013.01); *H01R 43/0263* (2013.01); *H05K 2201/10189* (2013.01); *H05K 2201/10287* (2013.01); *H05K 2201/10977* (2013.01)

(58) Field of Classification Search
CPC .. H01R 13/40; H01R 13/405; H01R 13/436; H01R 4/242; H01R 12/515; H01R 12/58; H01R 13/5213; H01R 43/005; H01R 43/01; H01R 43/0256; H01R 43/0263; H01B 7/0009; H05K 1/18; H05K 3/3405; H05K 2201/10189; H05K 2201/10287; H05K 2201/10977
See application file for complete search history.

(56) References Cited

U.S. PATENT DOCUMENTS

| 4,350,405 A | 9/1982 | Yapoudjian et al. |
| 4,367,004 A | 1/1983 | Fujiura et al. |

(Continued)

FOREIGN PATENT DOCUMENTS

| EP | 0234639 A1 | 9/1987 |
| EP | 0743700 A2 | 11/1996 |
| FR | 2535533 A1 | 5/1984 |
| FR | 2664433 A1 | 1/1992 |
| GB | 2047984 A | 12/1980 |
| JP | 2010257817 A | 11/2010 |

*Primary Examiner* — Carl Arbes
(74) *Attorney, Agent, or Firm* — Gokalp Bayramoglu

(57) ABSTRACT

Disclosed is a procedure for manufacturing a cable connector device with a blade and the structure of the cable connector device including a printed circuit board and a cable thread. a bore is made on the printed circuit board covered with a conductive layer, and then the head of the cable connector component is placed into the bore and is soldered to the conductive layer. Then, the cable threads are held in the bladed opening of the cable connector. In the next step, the entire unit is covered by a resin case, thereby also holding the cable threads in the opening of the cable connector. The case itself consists of a single part and does not require any other holding component or plastic shell. Given the small size of the case, there is a shortened warm up period.

32 Claims, 4 Drawing Sheets

A-A

(56) References Cited

U.S. PATENT DOCUMENTS

Figure 1:
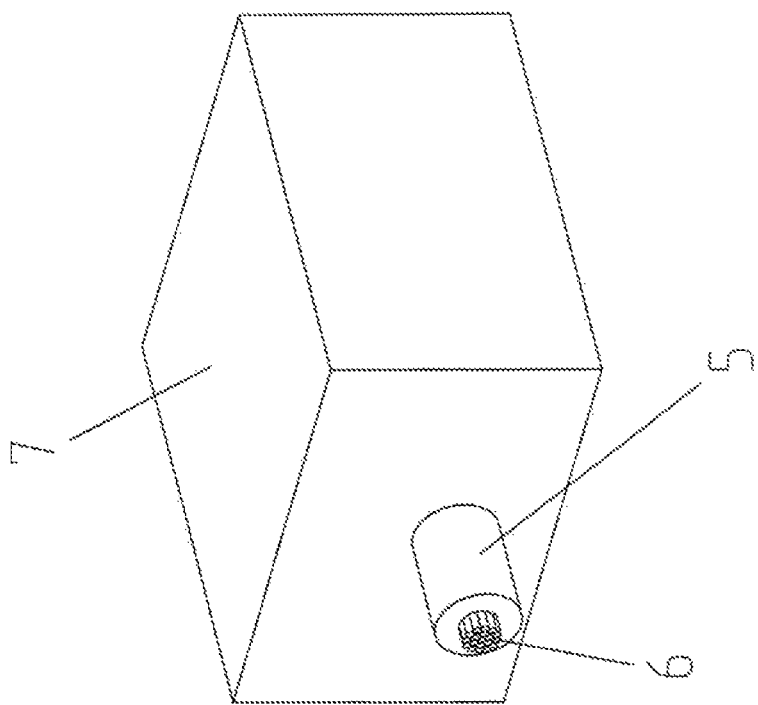

| | | |
|---|---|---|
| 4,691,977 A | 9/1987 | Marzili et al. |
| 5,059,137 A | 10/1991 | Dale et al. |
| 5,190,461 A * | 3/1993 | Oorui .................... H01R 24/50 439/63 |
| 5,683,266 A | 11/1997 | Guidi et al. |
| 5,772,452 A * | 6/1998 | Aoyama ................ H01R 12/73 439/74 |
| 5,984,735 A | 11/1999 | Daoud |
| 6,241,549 B1 | 6/2001 | Saka et al. |
| 2012/0003850 A1 | 1/2012 | Bishop |

* cited by examiner

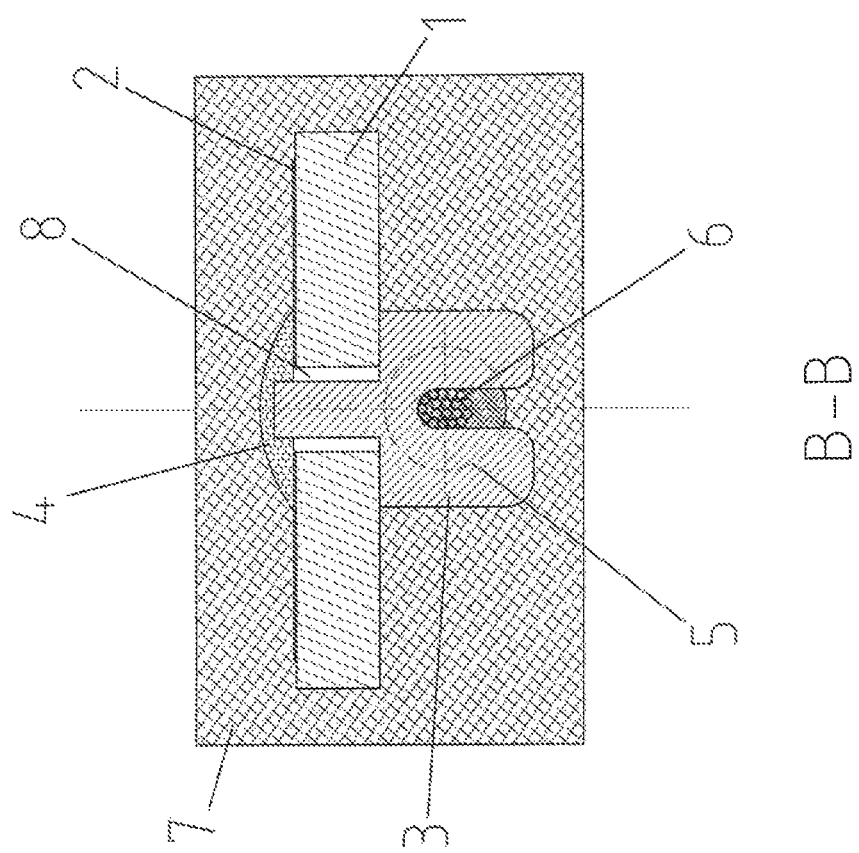
FIG. 6  B-B
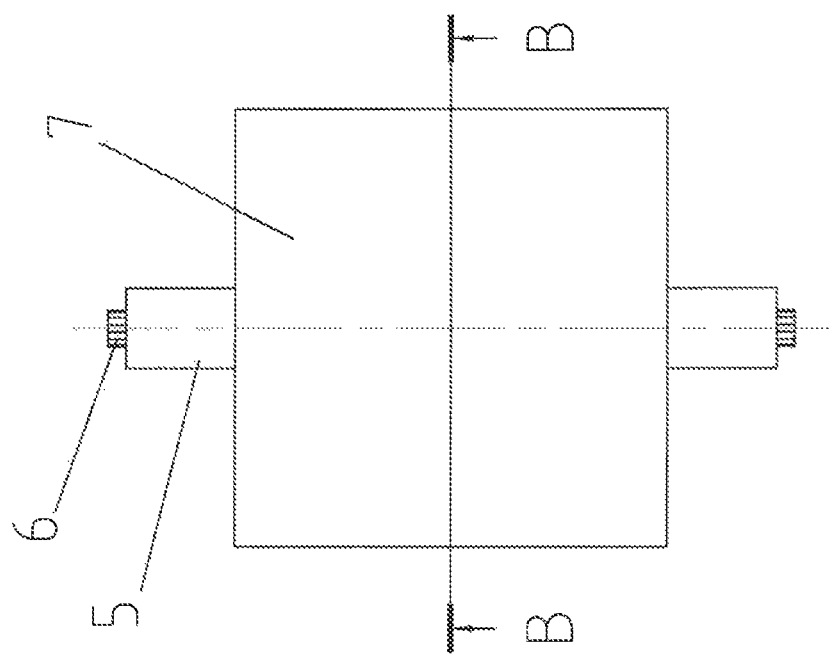
FIG. 5

METHOD OF PRODUCING A CABLE CONNECTOR DEVICE WITH BLADE

FIELD OF THE INVENTION

The subject of the invention is a procedure for manufacturing a cable connector device with blade and the cable connector device including a printed circuit board and a cable thread.

BACKGROUND OF THE INVENTION

US publication document No. US20120003850 A1 describes a bladed connector device consisting of two components. The solution can be automated, but its disadvantage is that it is not small, as the two complementary bladed components need to have a minimum size, due to the operation of the device. The cable is fixed by an additional fixing unit, a cap. The soldering and the placement of the cable threads are on the same side of the printed circuit board. The manufacturing of the invention described in the document is slow and depends on human intervention. The components may move and become damaged easily due to the fact that they need to be held numerous times.

The solution described in U.S. Pat. No. 5,683,266 A has a similar structure than the one described above. However, this invention does not require a case, as the cable may be inserted to the dedicated hole on the fork head made of a flexible material.

U.S. Pat. No. 5,984,735 A describes a bladed cable connector with a holding case.

European patent document No. EP0234639 A1 and British patent document No. GB2047984 A describes solutions where the case holding down the cable is mechanic means. This is performed so that the shape holding the bladed cable connector is complementary to the case and the case snaps into the appropriate position. The inventions are capable of holding more than one cable.

Another complicated invention is presented by Japanese patent document No. JP2010257817 A. In this case, the cable is held in place by the case by mechanic means; here, the case is to be turned with 90 degree to hold.

The cable connector device described by European patent document No. EP0743700 A2 holds two cables that are placed in a certain angle. The cables are held by springs, and no case is required.

The solution described in French publication document No. FR2535533 A1 relies on a flexible cable connector, so the cables can be held in the fork-shaped head without a case.

French patent document No. FR2664433 A1 and U.S. Pat. No. 4,350,405 A describes a similar fork-shaped cable connector made of elastic materials, which does not require the use of a case.

U.S. Pat. No. 4,367,004 A describes a composite cable connector invention with a case consisting of two components.

U.S. Pat. No. 4,691,977 A describes a larger device, where the fork-shaped cable connectors are lined up in two rows. The cables are inserted in parallel positions and are protected and held by a common case.

The invention described by U.S. Pat. No. 5,059,137 A also includes several cable connectors placed in rows. The bladed heads are of different sizes according to the different sizes of cables, and distance between the edges is always 1 to 1.5 times of the diameter of the cables.

A cable connector made of bent plates is described in U.S. Pat. No. 6,241,549 B1.

In conclusion, it can be established that all of the devices mentioned above consist of several parts, are complicated, and hard to automatize.

SUMMARY OF THE INVENTION

The purpose of the invention is to eliminate the shortfalls of the known solutions and to realize a device and a procedure that is simple and can be automatized. It is an objective to use a procedural sequence that is a worldwide novelty, in the course of which a bore is made on the printed circuit board covered with a conductive layer, and then the head of the cable connector component is placed into the bore and is soldered to the conductive layer. Then, the cable threads are held in the bladed opening of the cable connector, thereby cutting the insulation of the cable. At this point, the electric circuit consisting of the printed circuit board, the soldering, the cable connector, and the cable threads is closed. In the next step, the entire unit is covered by a resin case, thereby also holding the cable threads in the opening of the cable connector. Without the case, the cable threads would fall out of the opening of the cable connector. As already mentioned, the simplification of the device is an important objective. For this reason, the case consists of a single part and does not require any other holding component or plastic shell. The shortness of the warm-up period is also an important objective, to ensure the efficiency of the soldering. The can be reached by optimally reducing the size of the device. The needed size is statically excellent and keeps the warm-up and soldering period short. In case of using a 30% larger size, the warm-up period increases by 3 to 4 times, even if the size of the soldering bolt is increased. The accuracy of the device is also an objective, so the bore is made right before inserting the cable connector, and the component is held only once by the manufacturing machinery, thereby avoiding any damage to the small fork component and the cable threads.

The inventive step is based on the recognition that if the printed circuit board and the cable connector device is regarded as a single device and if the bore and the soldering of the cable connector component is made in a single movement of machinery, the cable threads can be connected much more precisely to the circuit board using the fork component. The inventive step also includes the recognition that if the size of the cable connector component is small, in comparison to the cable threads (the width of the shoulders of the cable connector component is 45 to 60 percent of the diameter of the cable insulation, and the opening of the cable connector is 65 to 95 percent of the diameter of the cable threads), then the warm-up period and the soldering period becomes significantly shorter, while the component remains statically satisfactory. The inventive step involves the design of the simple shape of the cable connector device, as a result of which the device and the procedure for its use can be automated. One process and a single act of holding is sufficient in the course of using the device, in the course of which the drilling of the printed circuit board, the placement and soldering of the cable connector component, the placement and holding of the cable threads, and, finally, the resin casing is performed. This manufacturing sequence is not known, but it is optimal. The casing is also a novelty, which does not require any additional device, as the case itself holds the threads to the cable connector device and the cable connector to the printed circuit board, and also covers the entire unit.

According to the set objective, the most general implementation form of the procedure according to the invention is described in claim 1. The various implementation forms are described in the claims.

The invention is presented in more detail on the basis of drawings and using a sample implementation form.

A BRIEF DESCRIPTION OF THE DRAWINGS

Figure 2:
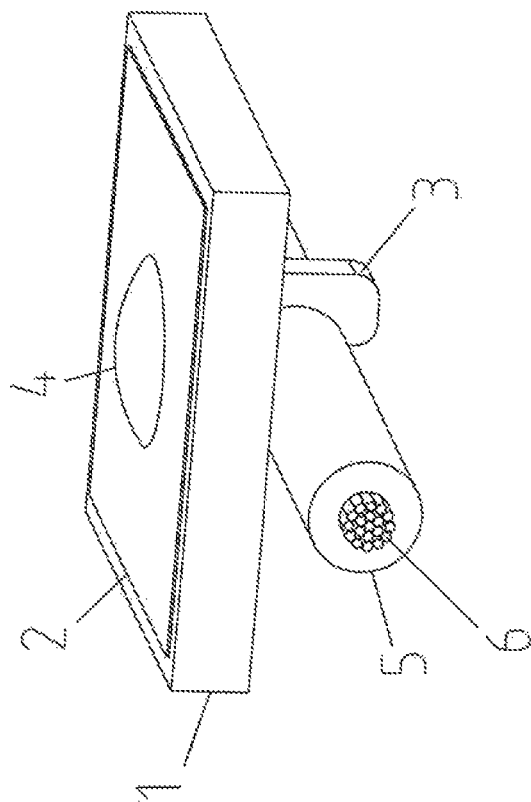
Figure 4:
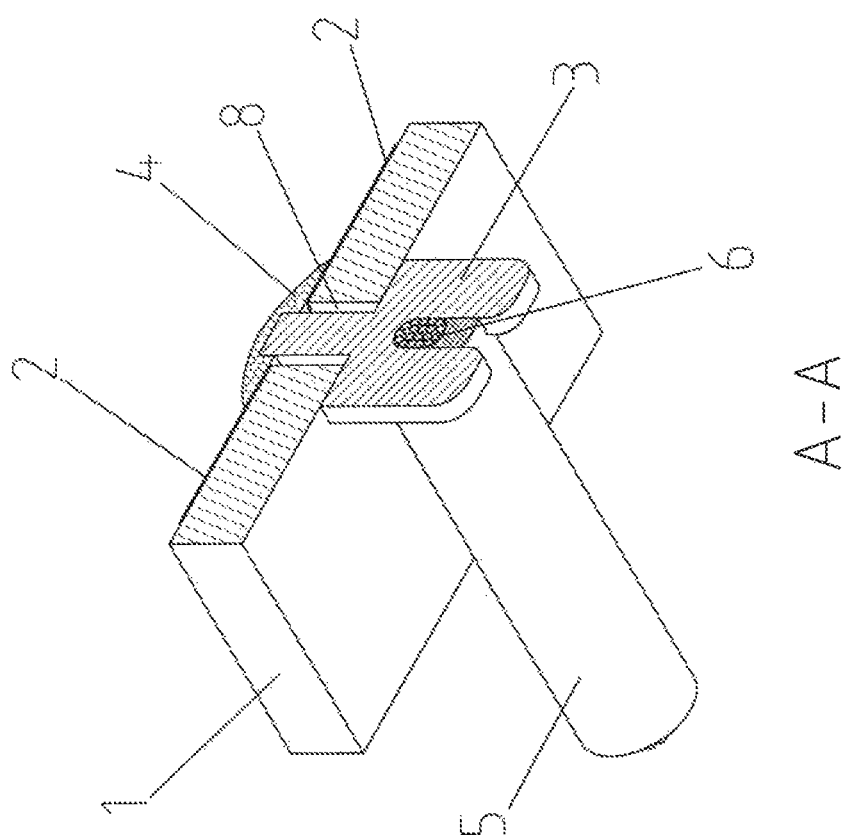
Figure 3:
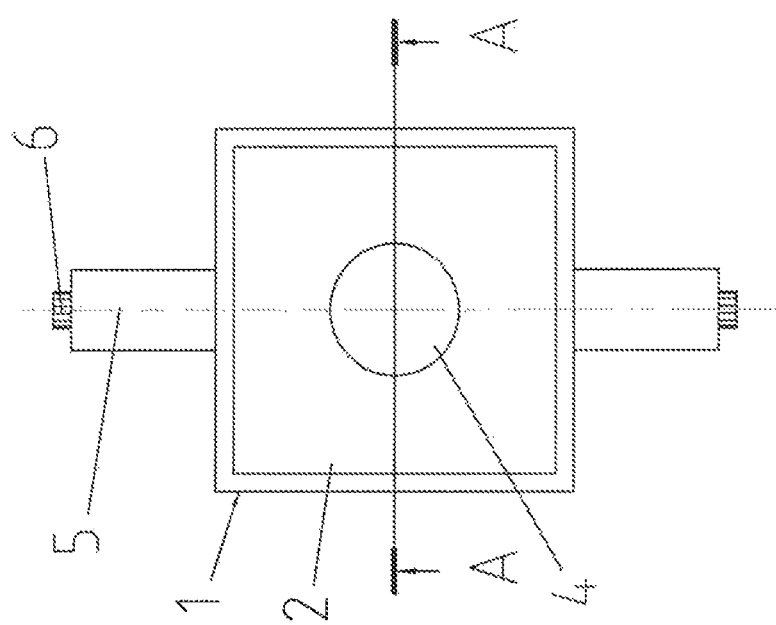
Figure 7:
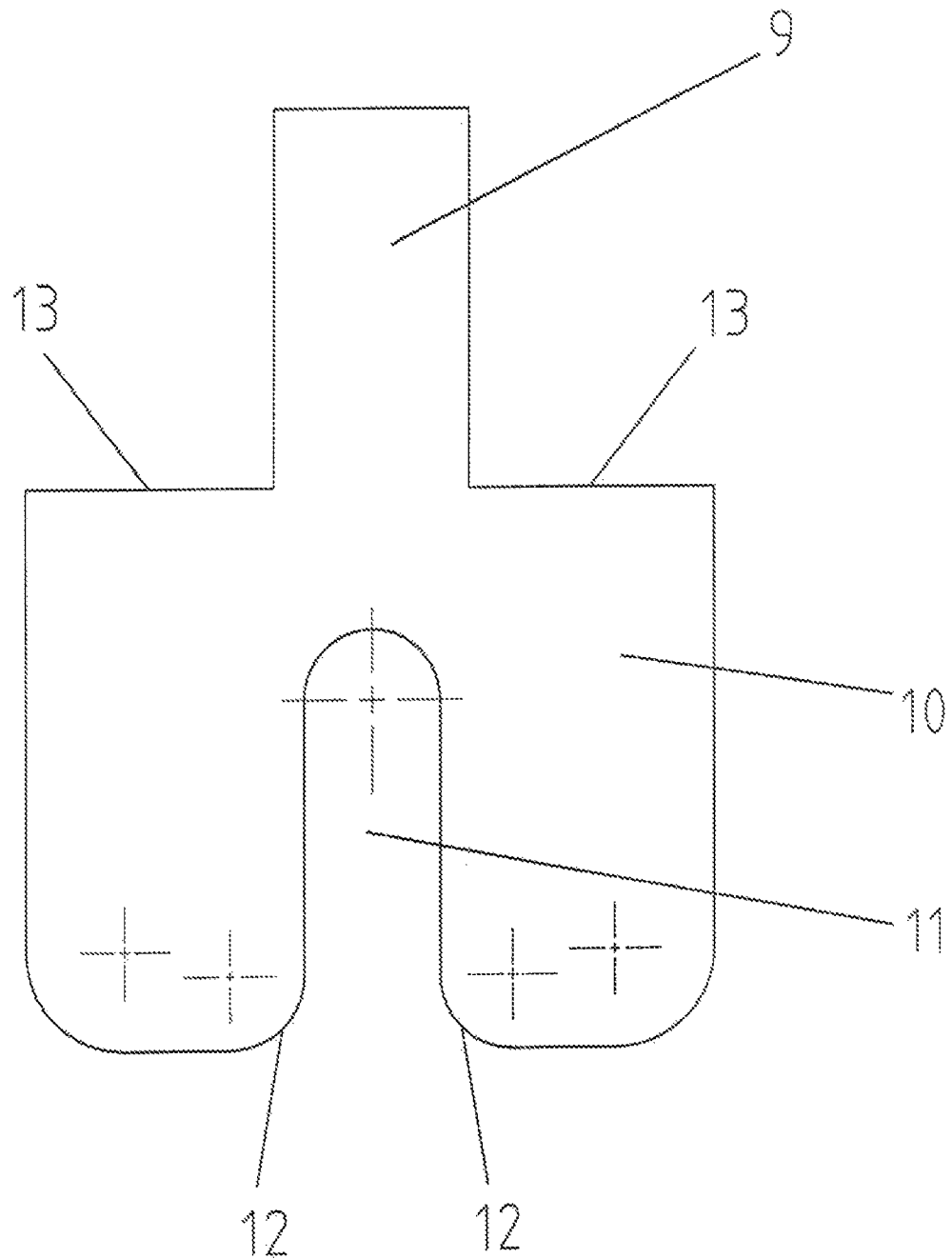

On the attached drawings,

FIG. 1 shows the axonometric drawing of the cable connector soldered to the printed circuit board, FIG. 2 shows the axonometric drawing of the cable connector component with a case, FIG. 3 shows the bird's eye view of the cable connector soldered to the printed circuit board, FIG. 4 shows the axonometric drawing of the cable connector soldered to the printed circuit board seen from below, and cut at the cable connector component, FIG. 5 shows the bird's eye view of the cable connector component with a case, FIG. 6 shows the section of the cable connector device with a case, and FIG. 7 shows the front view of the cable connector component.

FIG. 1 shows the cable connector component 3 fixed with soldering 4 onto the conductive layer 2 of the printed circuit board 1. The cable threads 6 are held in the cable connector component 3. The cable threads 6 have cable insulation 5, but the bladed head of the cable connector component 3 cuts the cable insulation 5 during insertion at the given point.

FIG. 2 shows the situation after the final step, where the case 7 covers the entire device completely. The case 7 is made of resin, which can take any shape using the easily removable mould. The case 7 holds the cable threads 6 in the cable connector component. No additional plastic shell or holding component is needed, as the case 7 performs the holding and closing functions in itself. The axonometric drawing shows as the cable threads 6 covered in cable insulation 5 run from the case.

FIG. 3 shows the printed circuit board 1 from above, from the direction of the soldering 4. The surface of the printed circuit board 1 is covered by the conductive layer 2. The cable threads 6 are connected to the printed circuit board 1 by a cable connector component. The cable threads 6 are covered by cable insulation 5. The height of the head 9 of the cable connector component 3 is 0 to 2 mm more than the total thickness of the printed circuit board and the conductive layer, and the width of the head 9 of the cable connector component 3 is 40 to 60 percent of the diameter of the cable insulation. The width of the shoulders 13 of the cable connector component 3 is set to 1.4 to 1.8 times of the diameter of the cable thread batch.

FIG. 4 presents the cable connector component 3 fixed by soldering 4 on the conductive layer 2 of the printed circuit board 1, but the device is shown here from below. The fork-shaped cable connector component 3 is placed in the bore 8 made in the printed circuit board 1. The role of the cable connector component 3 is to hold the cable threads 6 onto the printed circuit board 1. The batch of cable threads 6 is grasped into bladed head of the cable connector component 3. The cable connector component 3 cuts the cable insulation 5 on the cable threads during fixation, so the copper cable connector component 3 meets the cable threads 6 directly, there making the circuit uninterrupted.

FIG. 5 shows the device with the case 7. Below, the batch of cable threads 6 protected by cable insulation runs in both directions. In this condition of the device, the cable threads 6 are perfectly connected to the other components. The entire device is included and held together by the case.

FIG. 6 shows a section of the device with the case 7. The case 7 is made of resin and may be shaped freely with the removable mould. The figure shows how to bore 8 was made on the printed circuit board 1, into which the cable connector component 3 is placed. The cable connector component 3 is fixed to the conductive layer 2 of the printed circuit board 1 by soldering. The soldering 4 and the cable connector component 3 with the held cable threads 6 are on opposing sides of the printed circuit board 1. The cable threads 6 are covered in cable insulation 5, but it is broken in the cable connector component 3 as it is cut by the bladed head thereof. This ensures that the copper cable connector component 3 touches the cable threads 6 conducting electricity.

FIG. 7 shows the front view of the cable connector component 3, advantageously made of copper, before being fixed to the circuit. The cable connector component 3 consists of, among others, a head 9 that is used to fix it. The leg 10 of the cable connector component 3 is responsible for the cable connection itself, as the cable is placed into the opening in it. The device is extremely small, but, due to the inlet arc 12, the device is capable of bridging small differences in size. The size, width of the shoulders 13, and inlet arc 12 of the cable connector component 3 ensure that the device is affixed quickly and easily, it warms up and is soldered quickly, and is stable enough to perform its task.

DETAILED DESCRIPTION

In the course of using the invention and according to the desired objective, firstly, the bore 8 is produced on the printed circuit board 1 and the conductive layer 2 carrying the active or passive electric parts, then, secondly, the cable connector component 3—that is the head 9 of the cable connector component 3—is inserted into the bore 8. Then, the cable connector component 3 is affixed to the conductive layer 2 by soldering 4, and then the cable threads 6 covered in cable insulation 5 is held into the cable connector component 3. At this point, the cable insulation 5 is cut by the cable connector component 3, but the cable threads 6 are only pressed together in order to ensure that the conductive layer 2, the cable connector component 3, the soldering 4, and the cable threads 6 are electrically connected. Then, the printed circuit board 1, the conductive layer 2 and the active or passive parts connected to it, the cable connector component 3, the soldering 4, parts of the cable insulation 5 and the cable threads 6 in it are fixed into the case 7. The case 7 fills all gaps and holds the cable insulation 5 and the included cable threads 6 in the cable connector component 3. The case 7 can be shaped in any form using the removable mould. During the process described above, the cable connector component 3 is held only once, during which the above-mentioned acts—i.e. the making of the bore 8, the soldering 4, and the case 7—are carried out.

The cable connector device and manufacturing procedure have numerous advantages. An advantage of the invention is that the size of the cable connector device is really small, even relative to the cable threads. This accelerates soldering, but the result is still a stable unit. If smaller, the unit would bend and would be unfit for performing its task. If larger, the period of warm-up and soldering would be significantly longer. Minimising the period of soldering also means that even beat-sensitive parts can be placed in the vicinity of the connection point. This reduces the size of the device even further. Another advantage of the cable connector device is that the bore on the printed circuit board is made just before installing the cable connecting fork. In the case of other known inventions, the printed circuit board came with the bore already made, which resulted in significant differences, as the cutting was made after the bore. This resulting difference may even reach 1 mm, which in turns increases the size of, and the period required for, soldering. In the case of our invention, the bore is made on the already cut printed circuit board covered by the conductive layer, when the necessary location is known exactly. Due to the small sizes and the necessity of precise implementation, it is almost impossible to automate similar procedures. The tolerance of the bore is only 0.05 mm in any direction. The small cable connector fork and the cable thread may move or suffer damages easily, if held by a piece of production machinery several times. In this case, it is possible to have it held by a machine only once, and the machine can complete the entire process from producing the bore, through soldering, and until the placement of the case. Before applying the resin, the cable connector component may be released. This is a significant advantage, which can also ensure that the cable connector component will be fixed to the conductive layer accurately, that the circuit will be complete, and that the case will cover and hold the appropriate parts. Such a production sequence is unknown so far, but it provides the optimal system. The manufacturers of cable connectors do not deal with the printed circuit board itself but a really good device can be produced only if the printed circuit board is handled together with, and at the same time as, the cable connector. It is a significant advantage that the cable connector component consists of a single part and that it is small and very simple. The case also has advantageous characteristics. The resin case holds the soldering, the printed circuit board, and the conductive layer together, and it also holds the cable threads to the cable connector component. No other part, holder, plastic shell is needed. The case holds, encapsulates, covers, and protects the units. The case can be produced in any shape using the removable mould.

In addition to the above-mentioned examples, the invention can be implemented in other forms and with other production procedures within the scope of protection.

The invention claimed is:

1. A method for producing a bladed cable connector device, the method comprising:
    creating a bore on a printed circuit board while continuously holding the bore with machinery;
    inserting a cable connector component into the bore;
    soldering a head of the cable connector component to a conductive layer on the printed circuit board;
    holding a cable thread into the opening of the cable connector component;
    cutting into a cable insulation with a bladed edge of the cable connector component;
    releasing the cable connector component from the machinery; and
    fixing the bladed cable connector device with a case.

2. The method according to claim 1, wherein a plurality of shoulders of the cable connector component are set to 1.4 to 1.8 times of the diameter of a cable thread batch.

3. The method according to claim 1, further comprising: automating the process such that the machinery holding the cable connector component only holds the cable connector component once throughout the entire process.

4. The method according to claim 2, further comprising: automating the process such that the machinery holding the cable connector component only holds the cable connector component once throughout the entire process.

5. The method according to claim 1, further comprising: leading the cable thread batch on a side of the printed circuit board opposing a soldering.

6. The method according to claim 2, further comprising: leading the cable thread batch on a side of the printed circuit board opposing a soldering.

7. The method according to claim 3, further comprising: leading the cable thread batch on a side of the printed circuit board opposing a soldering.

8. The method according to claim 4, further comprising: leading the cable thread batch on a side of the printed circuit board opposing a soldering.

9. The method according to claim 1, wherein the shape of the case is designed using a removable mould.

10. The method according to claim 2, wherein the shape of the case is designed using a removable mould.

11. The method according to claim 3, wherein the shape of the case is designed using a removable mould.

12. The method according to claim 4, wherein the shape of the case is designed using a removable mould.

13. The method according to claim 5, wherein the shape of the case is designed using a removable mould.

14. The method according to claim 6, wherein the shape of the case is designed using a removable mould.

15. The method according to claim 7, wherein the shape of the case is designed using a removable mould.

16. The method according to claim 8, wherein the shape of the case is designed using a removable mould.

17. The method according to claim 1, wherein the bore is made after cutting the printed circuit board, just before inserting the cable connector component with a symmetric tolerance of 0.05 mm.

18. The method according to claim 2, wherein the bore is made after cutting the printed circuit board, just before inserting the cable connector component with a symmetric tolerance of 0.05 mm.

19. The method according to claim 3, wherein the bore is made after cutting the printed circuit board, just before inserting the cable connector component with a symmetric tolerance of 0.05 mm.

20. The method according to claim 4, wherein the bore is made after cutting the printed circuit board, just before inserting the cable connector component with a symmetric tolerance of 0.05 mm.

21. The method according to claim 5, wherein the bore is made after cutting the printed circuit board, just before inserting the cable connector component with a symmetric tolerance of 0.05 mm.

22. The method according to claim 6, wherein the bore is made after cutting the printed circuit board, just before inserting the cable connector component with a symmetric tolerance of 0.05 mm.

23. The method according to claim 7, wherein the bore is made after cutting the printed circuit board, just before inserting the cable connector component with a symmetric tolerance of 0.05 mm.

24. The method according to claim 8, wherein the bore is made after cutting the printed circuit board, just before inserting the cable connector component with a symmetric tolerance of 0.05 mm.

25. The method according to claim 9, wherein the bore is made after cutting the printed circuit board, just before inserting the cable connector component with a symmetric tolerance of 0.05 mm.

26. The method according to claim 10, wherein the bore is made after cutting the printed circuit board, just before inserting the cable connector component with a symmetric tolerance of 0.05 mm.

27. The method according to claim 11, wherein the bore is made after cutting the printed circuit board, just before inserting the cable connector component with a symmetric tolerance of 0.05 mm.

28. The method according to claim 12, wherein the bore is made after cutting the printed circuit board, just before inserting the cable connector component with a symmetric tolerance of 0.05 mm.

29. The method according to claim 13, wherein the bore is made after cutting the printed circuit board, just before inserting the cable connector component with a symmetric tolerance of 0.05 mm.

30. The method according to claim 14, wherein the bore is made after cutting the printed circuit board, just before inserting the cable connector component with a symmetric tolerance of 0.05 mm.

31. The method according to claim 15, wherein the bore is made after cutting the printed circuit board, just before inserting the cable connector component with a symmetric tolerance of 0.05 mm.

32. The method according to claim 16, wherein the bore is made after cutting the printed circuit board, just before inserting the cable connector component with a symmetric tolerance of 0.05 mm.

\* \* \* \* \*